(12) United States Patent
Seo et al.

(10) Patent No.: US 11,217,958 B2
(45) Date of Patent: Jan. 4, 2022

(54) SEMICONDUCTOR LASER DIODE LIGHT SOURCE PACKAGE

(71) Applicant: ELECTRONICS AND TELECOMMUNICATIONS RESEARCH INSTITUTE, Daejeon (KR)

(72) Inventors: Hong-Seok Seo, Daejeon (KR); Bongki Mheen, Daejeon (KR); Gyu Dong Choi, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 525 days.

(21) Appl. No.: 16/176,453

(22) Filed: Oct. 31, 2018

(65) Prior Publication Data

US 2019/0181605 A1    Jun. 13, 2019

(30) Foreign Application Priority Data

Dec. 7, 2017  (KR) .................. 10-2017-0167759

(51) Int. Cl.
*H01S 3/094* (2006.01)
*H01S 5/10* (2021.01)
(Continued)

(52) U.S. Cl.
CPC ...... *H01S 3/094007* (2013.01); *H01S 3/0064* (2013.01); *H01S 3/06754* (2013.01); *H01S 3/0941* (2013.01); *H01S 3/10023* (2013.01); *H01S 5/02415* (2013.01); *H01S 5/0612* (2013.01); *H01S 5/06804* (2013.01); *H01S 5/1028* (2013.01); *H01S 3/09415* (2013.01); *H01S 3/094076* (2013.01); *H01S 3/1608* (2013.01); *H01S 3/1618* (2013.01);
(Continued)

(58) Field of Classification Search
CPC .. H01S 5/02415; H01S 5/0612; H01S 3/2308; H01S 2301/02; G02B 27/1006; G02B 27/141; G02B 27/142; G02B 27/148
See application file for complete search history.

(56) References Cited

U.S. PATENT DOCUMENTS 5,263,036 A * 11/1993 Bernardi ............ H01S 3/06708
                                              372/6
7,133,195 B2   11/2006 Ahn et al.
(Continued)

FOREIGN PATENT DOCUMENTS

| KR | 0155537 | 12/1998 |
|----|---------|---------|
| KR | 20100109981 A | 10/2010 |
| KR | 20130118340 A | 10/2013 |
| KR | 20170099885 A | 9/2017 |
| KR | 20170121596 | 11/2017 |

*Primary Examiner* — Eric L Bolda

(57) ABSTRACT

A semiconductor laser diode light source package includes: a seed light source for outputting signal beams; a pump beam source for outputting pump beams; and at least one mirror for transmitting the signal beams to a core of an output optical fiber and transmitting the pump beams to first cladding of the output optical fiber, wherein the seed light source, the pump beam source, and the at least one mirror are realized in a semiconductor chip, and the output optical fiber is connected to an end terminal of the semiconductor laser diode light source package.

14 Claims, 8 Drawing Sheets

(51) Int. Cl.
  *H01S 5/068*  (2006.01)
  *H01S 5/024*  (2006.01)
  *H01S 3/10*  (2006.01)
  *H01S 5/06*  (2006.01)
  *H01S 3/067*  (2006.01)
  *H01S 3/0941*  (2006.01)
  *H01S 3/16*  (2006.01)
  *H01S 5/12*  (2021.01)
  *H01S 5/062*  (2006.01)
  *H01S 3/00*  (2006.01)
  *H01S 5/02251*  (2021.01)

(52) U.S. Cl.
  CPC ....... *H01S 5/02251* (2021.01); *H01S 5/06216* (2013.01); *H01S 5/12* (2013.01); *H01S 2301/02* (2013.01)

(56) References Cited

U.S. PATENT DOCUMENTS

| | | |
|---|---|---|
| 7,537,395 B2 | 5/2009 | Savage-Leuchs |
| 8,611,003 B2 | 12/2013 | Ahn et al. |
| 9,865,991 B2 | 1/2018 | Kim |
| 10,003,168 B1* | 6/2018 | Villeneuve ............. G02B 27/10 |
| 2006/0197960 A1 | 9/2006 | Bazylenko |
| 2011/0116169 A1* | 5/2011 | Hudman .............. G02B 27/148 |
| | | 359/634 |
| 2015/0146409 A1* | 5/2015 | Furuta ................ G02B 19/0028 |
| | | 362/84 |
| 2016/0043800 A1* | 2/2016 | Kingsbury ......... H04B 7/18513 |
| | | 398/125 |

\* cited by examiner

<Prior Art>

<Prior Art>

FIG. 3

| Pump power | 1.2W | 3.8W | 6.4W |
|---|---|---|---|
| 50 kHz | 74.4 | 266.4 | 368.8 |
| 100 kHz | 58.5 | 209 | 316 |
| 500 kHz | 25 | 89.2 | 142.7 |
| 1000 kHz | 16.3 | 54.5 | 90.2 |

SEMICONDUCTOR LASER DIODE LIGHT SOURCE PACKAGE

CROSS-REFERENCE TO RELATED APPLICATION

This application claims priority to and the benefit of Korean Patent Application No. 10-2017-0167759 filed in the Korean Intellectual Property Office on Dec. 7, 2017, the entire contents of which are incorporated herein by reference.

BACKGROUND OF THE INVENTION

(a) Field of the Invention

The present invention relates to a semiconductor laser diode light source package.

(b) Description of the Related Art

A laser radar system is an image sensor device for acquiring 3-dimensional images, and is used in many fields such as for unmanned self-driving robots and vehicles, confirmation of structure change states, detection of landslides, and military robots.

The laser radar system does not build images from external light, but measures light received by allowing a light source to discharge light, it may be usable regardless of environments, and it may output excellent images.

The laser radar system outputs a laser light to an object and measures light reflected therefrom to thus find a distance to the object. The light source includes a pulse light source and a continuous wave (CW) light source. The pulse light source is advantageous in remote-distance measurement, and a resolution has been improved to a centimeter level according to technical developments, so the pulse type is applied more compared to the CW type. In the light source viewpoint, the pulse type, compared to the CW type, may generate less heat from the light source and may generate a very high peak output of the pulse, so it is advantageous in remote-distance measurement.

A pulse laser method for using a semiconductor laser as a seed light source, amplifying the light source through an optical fiber amplifier, and accordingly generating a desired peak output, is referred to as an optical fiber-based master oscillator and power amplifier (MOPA) method. Here, the master oscillator signifies a semiconductor laser and the power amplifier signifies an optical fiber amplifier. The semiconductor laser used as a seed light source generally uses a distributed feedback (DFB) laser, its line width is narrow, and it generates ns pulses through modulation. Further, it generates single-mode and short-wavelength outputs, so it has excellent beam quality. Light output by the laser is input to the optical fiber amplifier and is then amplified, and the optical fiber amplifier uses a pump laser for high-power amplification. A rare-earth element added gain medium for generating amplification at a corresponding wavelength and a filter are used, and an optical isolator is used at an end. In this instance, when the optical fiber amplifier is configured to have multiple stages so as to realize a higher output, pulse outputs that are equal to or greater than a kilowatt are acquired. The optical fiber-based MOPA laser uses many elements so as to configure the optical fiber amplifying stages, and hence, a volume of the entire system increases.

SUMMARY OF THE INVENTION

The present invention has been made in an effort to provide a semiconductor laser diode light source package for outputting high-power laser beams and allowing manufacture at a low price and with a very small size.

An exemplary embodiment of the present invention provides a semiconductor laser diode light source package. The semiconductor laser diode light source package includes: a seed light source for outputting signal beams; a pump beam source for outputting pump beams; and at least one mirror for transmitting the signal beams to a core of an output optical fiber and transmitting the pump beams to a first cladding of the output optical fiber, wherein the seed light source, the pump beam source, and the at least one mirror are realized in a semiconductor chip, and the output optical fiber is connected to an end terminal of the semiconductor laser diode light source package.

The output optical fiber may be a double clad fiber configured with the core, the first cladding, and secondary cladding.

A gain medium may be doped to the core of the output optical fiber.

The semiconductor laser diode light source package may further include a first collimation lens for transforming the signal beams into parallel beams and transmitting the same to the at least one mirror.

The at least one mirror may transmit one of the signal beams and the pump beams, and may reflect the other thereof to transmit the signal beams to the core of the output optical fiber and transmit the pump beams to the first cladding of the output optical fiber.

When a mirror is used, respective sides of the mirror may be coated with a dielectric material.

One of the dielectric material coated sides of the mirror may reflect the pump beams, and the other thereof may reflect backward amplified spontaneous emission (ASE) beams that are different from a wavelength band of signal beams output by the output optical fiber in a direction that is different from the direction in which the pump beams proceed or to a different position.

The mirror may have a wedge form.

When two mirrors are used, one side of each of the two mirrors may be coated with a dielectric material, one of the two mirrors may reflect pump beams, and the other thereof may reflect backward amplified spontaneous emission (ASE) beams that are different from the wavelength band of signal beams output by the output optical fiber.

The semiconductor laser diode light source package may further include a focusing lens for concentrating signal beams having passed through the mirror and pump beams reflected through the mirror and inputting the same to a core of the output optical fiber and a first cladding.

The semiconductor laser diode light source package may further include a gain medium connected to an end terminal of the output optical fiber.

An end cap may be mounted to an end terminal of the output optical fiber.

The semiconductor laser diode light source package may further include a thermistor for measuring a temperature of the seed light source.

The semiconductor laser diode light source package may further include a Peltier element for maintaining a temperature of the seed light source.

The semiconductor laser diode light source package may further include an optical isolator provided between the seed light source and the at least one mirror.

The seed light source and the pump beam source may be mounted on different Peltier elements.

BRIEF DESCRIPTION OF THE DRAWINGS

FIG. 3 shows test results for measuring output characteristics of FIG. 2.

DETAILED DESCRIPTION OF THE EMBODIMENTS

Figure 1:
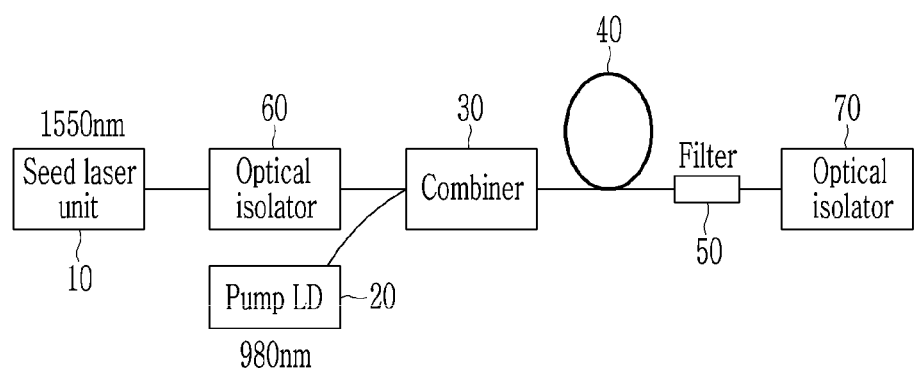
FIG. 1 shows an example of an existing optical fiber-based master oscillator and power amplifier (MOPA) laser.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Unless explicitly described to the contrary, the word "comprise" and variations such as "comprises" or "comprising" will be understood to imply the inclusion of stated elements but not the exclusion of any other elements A semiconductor laser diode light source package according to an exemplary embodiment of the present invention will now be described in detail with reference to the drawings.

FIG. 1 shows an example of an existing optical fiber-based master oscillator and power amplifier (MOPA) laser.

Referring to FIG. 1, the optical fiber-based MOPA laser includes a seed laser unit 10, a pump laser diode (LD) 20, a combiner 30, an erbium-doped fiber (EDF) 40 used as a gain medium, a filter 50, and optical isolators 60 and 70. A structure shown in FIG. 1 is the simplest optical fiber-based MOPA laser.

The seed laser unit 10 is used as a seed light source for generating signal beams, and it outputs single mode pulse beams at equal to or less than 2 ns. For example, the seed laser unit 10 outputs beams with a 1550 to 1640 nm wavelength.

The pump LD 20 is used as a pump beam source, and for example, it outputs beams with the 980 nm wavelength.

The EDF 40 is produced by adding a specific material (e.g., erbium) to the optical fiber, and it performs an optical amplification function.

The beams of the seed laser unit 10, that is, input signals, pass through the optical isolator 60, they are combined with the beams provided by the pump LD 20 through the combiner 30, and they are injected into a core of the EDF 40. When beam energy of the pump LD 20 is injected into the EDF 40, erbium atoms are transited to the excited state, they are induced and discharged in the excited state by the beams that are input with the 1550 nm wavelength from the seed laser unit 10, and an optical amplification phenomenon of the input signal is generated. The amplified beam signal is output through the filter 50 and the optical isolator 70.

When an additional amplifier is provided next to the optical isolator 70 so as to acquire higher output, it is possible to improve the output, and the amplifier may be generally configured with two to three stages. It is also possible to use one stage depending on the laser radar application fields, and when the high output is needed, it is possible to improve the output through a multi-stage amplifier.

Figure 2:
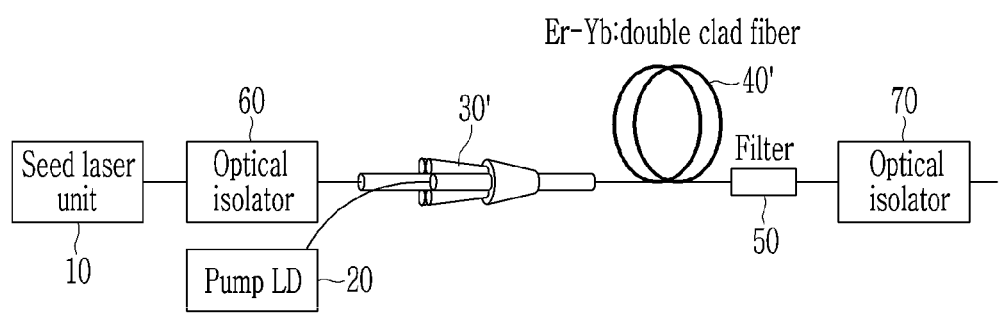
FIG. 2 shows another example of an existing optical fiber-based master oscillator and power amplifier (MOPA) laser.

FIG. 2 shows another example of an existing optical fiber-based master oscillator and power amplifier (MOPA) laser beams.

The optical fiber-based MOPA laser shown in FIG. 2 is similar to that of FIG. 1 in its form, but it uses an optical fiber 40' in a double cladding structure configured with a combination (Er—Yb) of ytterbium (Yb) and erbium (Er) as a gain medium.

Further, in the case of FIG. 1, the optical beam of the pump LD 20 proceeds through the core of the EDF 40 that is an optical fiber, and the optical beam of the seed laser unit 10 proceeds through the core of the EDF 40 and is amplified, and in the case of FIG. 2, the optical beam of the pump LD 20 proceeds along a cladding of the optical fiber 40' and the optical beam of the seed laser unit 10 proceeds through the core of the optical fiber 40' and is amplified. Therefore, in the case of FIG. 2, a combiner 30' for combining the optical beam of the pump LD 20 and the optical beam of the seed laser unit 10 is different that of from FIG. 1.

A wavelength division multiplexing (WDM) combiner is used as the combiner 30 in the case of FIG. 1, and a signal-pump combiner is used as the combiner 30' in the case of FIG. 2. A laser peak output of about 3 W is obtained with pumping of about 100 mW at the output end of FIG. 1, and the case of FIG. 2 may acquire a peak output of about 300 W. The structure of FIG. 1 is better than the structure of FIG. 2 in the viewpoint of noise. However, the structure of FIG. 2 may increase pumping power and it pumps substantially more than 5 W by the cladding, so it has the merit of acquiring the peak output of 300 W.

FIG. 3 shows a test result for measuring output characteristics of FIG. 2 when the peak output of the seed laser unit 10 is equal to or less than 10 mW and an average output is −34.8 dBm.

As shown in FIG. 3, intensity of the peak output changes according to pumping power of the pump LD 20 and repetition rates (50 kHz, 100 kHz, 500 kHz, and 1000 kHz) of the seed laser unit 10. The peak output amplified in the pulse condition of 100 kHz and 2 ns is 316 W, and the peak output is reduced at repetition rates that are greater than that. When the pumping power is reduced, the peak output is accordingly reduced. It is possible to amplify the peak output of the seed laser unit 10 of several milliwatts to be equal to or greater than 100 W by using the optical fiber-based MOPA laser configured with a single-stage amplifier shown in FIG. 2.

In the viewpoint that the laser radar light source made of a recently manufactured high-power semiconductor laser diode has a maximum peak output of 80 W, a pulse width of 5 ns, and repetition rates of equal to or less than 50 KHz, its beam quality is not excellent, but it is used as a light source, and it is known that the MOPA structure achieves the peak output of several hundreds of watts at high repetition rates, its pulse width is equal to or less than 2 ns, the repetition rate is close to 100 kHz, and it outputs a single mode, so it is appropriate to be used as a laser radar light source.

Figure 4:
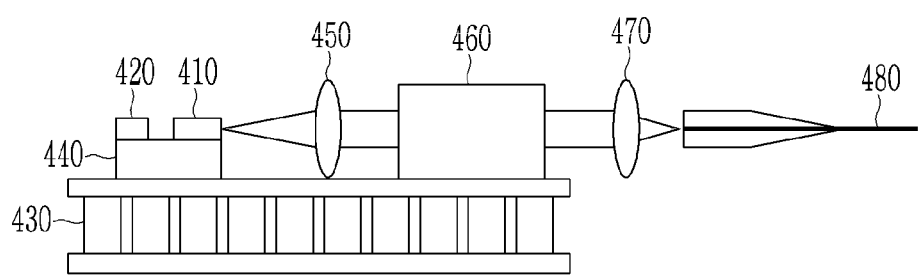
FIG. 4 shows a semiconductor LD package configured by connecting a typical signal LD to an optical fiber.

FIG. 4 shows a semiconductor LD package configured by connecting a typical signal LD to an optical fiber.

Referring to FIG. 4, the semiconductor LD package includes a seed laser unit 410, a thermistor 420, a Peltier element 430, a heat sink 440, a collimation lens 450, an optical isolator 460, a focusing lens 470, and an output optical fiber 480. The seed laser unit 410, the thermistor 420, the collimation lens 450, and the optical isolator 460 operate as a signal beam source.

The Peltier element 430 maintains the temperature of the seed laser unit 410, and the thermistor 420 is an electronic element for measuring the temperature of the seed laser unit 410. The thermistor 420 is provided to be adjacent to the seed laser unit 410. The heat sink 430 may be attached between the Peltier element 430 and the seed laser unit 410 to discharge the heat generated by the seed laser unit 410.

The beams output by the seed laser unit 410 are converted into parallel beams by the collimation lens 450. Some of the beams having passed through the collimation lens 450 are passed through by the optical isolator 460. The beams having passed through the optical isolator 460 are collected by the focusing lens 470 and are transmitted to the core of the output optical fiber 480. Here, the output optical fiber 480 is a single clad fiber, and in consideration of the structure, the beams do not proceed to the cladding but the same proceed by the core.

Figure 5:
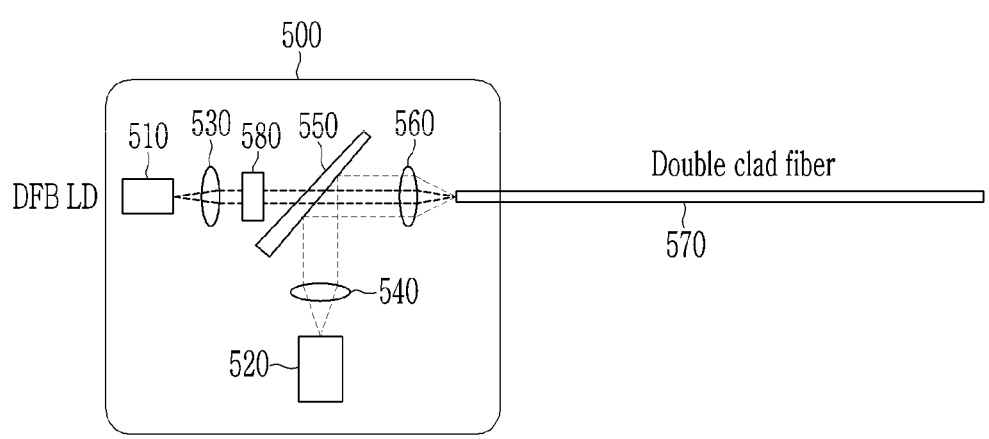
FIG. 5 shows a semiconductor LD package according to an exemplary embodiment of the present invention.

FIG. 5 shows a semiconductor LD package according to an exemplary embodiment of the present invention.

Referring to FIG. 5, the semiconductor LD package has a structure in which an optical fiber-based MOPA laser structure that is similar to that of FIG. 2 is installed in one semiconductor chip 500.

The beams output by a distributed feedback (DFB) LD 510 that is a seed light source and the beams output by a pump LD 520 that is a pump beam source are respectively transformed into parallel beams through collimation lenses 530 and 540 and are transmitted to a dichroic mirror 550. In this instance, the beams output by the DFB LD having passed through the collimation lens 530 may be transmitted to the dichroic mirror 550 through an optical isolator 580. The dichroic mirror 550 transmits the beams output by the DFB LD 510, and reflects the beams output by the pump LD 520 and transmits the same to a focusing lens 560. Differing from this, the dichroic mirror 550 may be configured so that it may reflect the beams output by the DFB LD 510 and may transmit the beams output by the pump LD 520 to the focusing lens 560. The beams output by the DFB LD 510 through the focusing lens 560 and the beams output by the pump LD 520 are transmitted to an output optical fiber 570. In this instance, the beams of the DFB LD 510 having passed through the dichroic mirror 550 are coupled to the core of the optical fiber 570 through the focusing lens 560, and the beams of the pump LD 520 that are reflected from the dichroic mirror 550 are coupled by a first cladding of the optical fiber 570 through the focusing lens 560.

The output optical fiber 570 is a double clad fiber, and it is an optical fiber in which signal beams proceed by the core and pump beams proceed to the first cladding. The core of the output optical fiber 570 may be doped with an amplifiable gain medium. When the gain medium is not doped to the core of the output optical fiber 570, a gain medium with an appropriate length may be connected to the end terminal of the output optical fiber 570 and used. Further, a gain medium that is desirable by a user may be connected and used. An end cap is provided to the end terminal of the gain medium to minimize the signal reflected from the end terminal of the optical fiber so that undesired lasing may not be generated in the gain medium by backward ASE proceeding from the reflection at the end terminal. The merits of the semiconductor LD package structure include: the structure of FIG. 2 may be manufactured to be very compact, it is possible to remove an external optical isolator (70 of FIG. 2) and a signal-pump combiner (30' of FIG. 2), and a peak output that is equal to or greater than 300 W may be generated with one laser package by a combination of the seed light source and the pump beam source. The intensity of the peak output may reach the higher output that is equal to or greater than 300 W by controlling the length of the gain medium and the intensity of the pump LD 520.

As shown in FIG. 4, a thermistor for measuring the temperature of the DFB LD 510 may be added to a rear terminal of the DFB LD 510. Further, as shown in FIG. 4, the DFB LD 510, the thermistor, the collimation lens, and the optical isolator 580 may be provided on a Peltier element and may be mounted thereon. A thermistor for measuring the temperature of the pump LD 520 may be added to the rear end of the pump LD 520, a pump LD 520, a collimation lens of the pump LD 520, and a thermistor of the pump LD 520 may be mounted on another Peltier element, and they may be mounted without the Peltier element.

The temperature of the DFB LD 510 may be independently controlled regardless of the pump LD 520. It is desirable to thermally isolate the signal beam source and the pump beam source from each other. Here, the signal beam source indicates the structure including the DFB LD 510, the collimation lens 530 of the DFB LD 510, the thermistor of the DFB LD 510, and the dichroic mirror 550, and the pump beam source indicates the structure including the pump LD 520, the collimation lens 540 of the pump LD 520, and the thermistor of the pump LD 520.

The signal beam source may generate a pulse of about 2 ns by applying electrical intensity modulation by an external driver (not shown), and the pump beam source may drive the pump LD 520 with a desired power output by applying a current by the external driver.

The signal beam source and the pump beam source may respectively be configured to be a chip. The semiconductor LD package may include a connector for supplying a current to the chip configuring the signal beam source and the pump beam source in the package.

Further, it is important to protect the pump beam source chip and the signal beam source chip from backward amplified spontaneous emission (ASE) beams of the gain medium.

For example, when the gain medium is ytterbium (Yb) or thulium (Tm), the backward ASE caused by the gain medium pass through the dichroic mirror 550 and are input to the DFB LD 510 that is a seed light source, and not to the pump beam source chip, so as shown in FIG. 4, the optical isolator 580 may be installed between the collimation lens 530 and the dichroic mirror 550. Backward ASE scattering may be prevented and the DFB LD 510 may be protected by the optical isolator 580 provided between the collimation lens 530 and the dichroic mirror 550.

On the contrary, when the gain medium is a combination (Er—Yb) of erbium and ytterbium, the backward ASE beams are reversely output to two wavelength bands from the core of the output optical fiber 570. One of the two wavelength bands is the band of 1520-1570 nm that is the amplification band of the combination (Er—Yb) of erbium and ytterbium. The wavelength of the signal beams is in this band. The ASE beams of the band of 1520-1570 nm are input not to the pump LD 520 but to the DFB LD 510. As described above, the backward ASE beams may be removed by the optical isolator 580 installed between the collimation lens 530 and the dichroic mirror 550. The other of the two wavelength bands is the band of 1030-1080 nm. The backward ASE beams of this band must be removed by a filter so that they may not be input to the pump LD 520 or the DFB LD 510.

Figure 6:
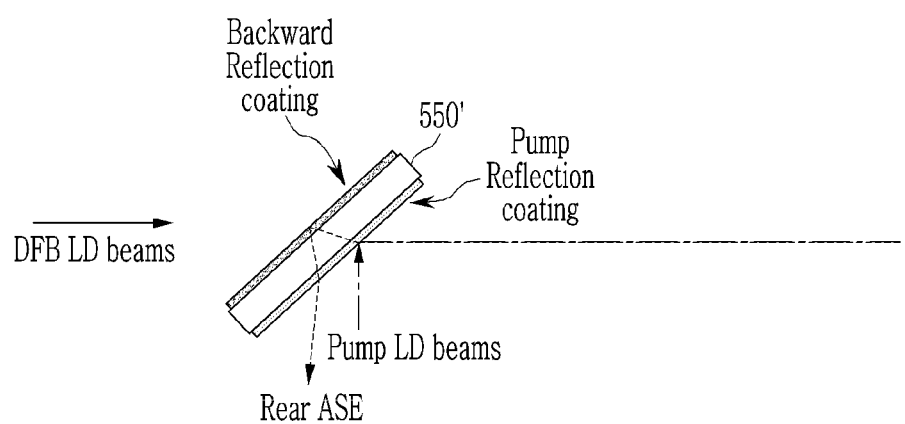
FIG. 6 to FIG. 8 show structures in which a filter is added to a dichroic mirror of FIG. 5 so as to remove a backward ASE when a gain medium is Er—Yb, respectively.
Figure 7:
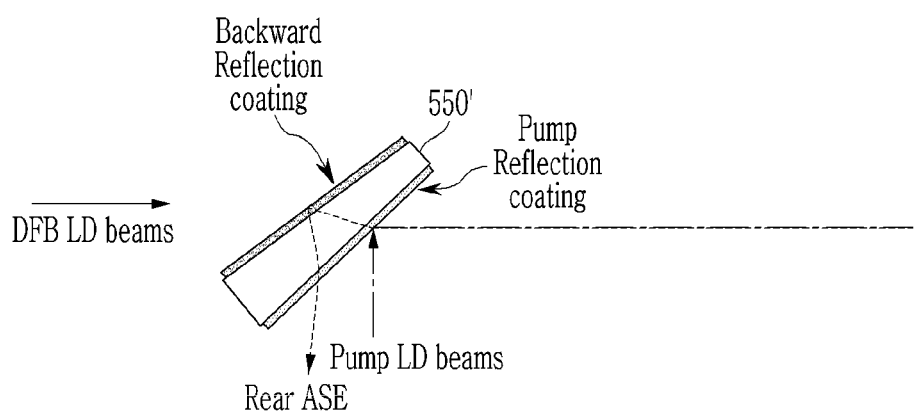
Figure 8:
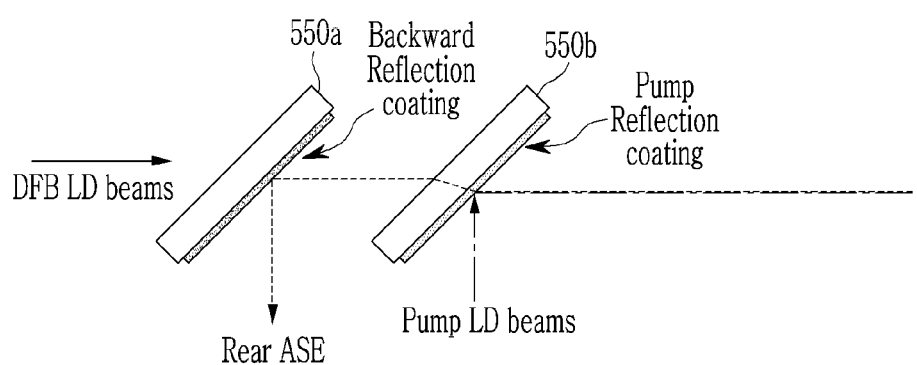

FIG. 6 to FIG. 8 show structures in which a filter is added to a dichroic mirror of FIG. 5 so as to remove a backward ASE when a gain medium is Er—Yb, respectively.

Referring to FIG. 6, respective sides of the dichroic mirror 550 may be coated with a dielectric material so that they may operate as a filter. In this instance, the respective sides of the dichroic mirror 550 may be coated with a dielectric material so that two wavelengths may be reflected at different positions on the respective sides of the dichroic mirror 550. First, the beams of the pump LD 520 are input on a bottom side of the dichroic mirror 550, are reflected on the right dielectric material coated side of the dichroic mirror 550, and are input to the output optical fiber 570. The ASE beams in the band of 1030-1080 nm are reflected by the left dielectric material coated side of the dichroic mirror 550 and proceed in a lower direction, but they proceed to a position that is different from the proceeding direction of the pump LD 520 and do not influence the pump LD 520.

Differing from this, referring to FIG. 7, a wedge may be provided to the dichroic mirror 550 so that reflection angles of the side on which the beams of the pump LD 520 are reflected and the side on which the backward ASE beams are reflected may become different. According to the above-noted structure, compared to FIG. 6, the backward ASE beams are reflected by a dichroic mirror 550' and then proceed to the position that is further distant from the proceeding position of the pump LD 520. Therefore, stability of the pump LD 520 may be increased.

Further, as shown in FIG. 8, two dichroic mirrors 550a and 550b of which one of the respective sides is coated with a dielectric material may be used. The two dichroic mirrors 550a and 550b are spatially separated and positioned. One of the two dichroic mirrors 550a and 550b may reflect the beams of the pump LD 520, and the other may reflect the backward ASE beams. That is, by providing the two dichroic mirrors 550a and 550b of which one of the sides of each is coated with a dielectric material, the area where the beams of the pump LD 520 are reflected and the area where the beams of the backward ASE beams are reflected may be separated.

The dichroic mirrors shown in FIG. 6 to FIG. 8 have the structure that does not hinder the beams output by the DFB LD 510 that is a seed light source from transmitting and proceeding to the output optical fiber 570.

According to the exemplary embodiment of the present invention, the semiconductor laser diode light source package with a high peak output may be configured by using one seed light source and at least one pump beam source.

The semiconductor laser diode light source package according to an exemplary embodiment of the present invention is somewhat larger or similar to the existing butterfly package, it may generate a 300 W-level output as a single package although it is small in size, it may output high-quality pulses, and it may extend the laser radar image to a farther distance.

In addition, it has many merits compared to the existing method for directly disposing a plurality of multi-mode core laser diodes with a 905 nm wavelength, in that the chip is small, it is connected with optical fibers to connect a plurality of semiconductor laser diode light source packages, and it is arranged at a desired position.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A semiconductor laser diode light source package comprising:
   a seed light source for outputting signal beams;
   a pump beam source for outputting pump beams; and
   at least one mirror for transmitting the signal beams to a core of an output optical fiber and transmitting the pump beams to a first cladding of the output optical fiber,
   wherein the seed light source, the pump beam source, and the at least one mirror are realized in a semiconductor chip, and the output optical fiber is connected to an end terminal of the semiconductor laser diode light source package,
   wherein when a mirror is used, respective sides of the mirror are coated with a dielectric material, and
   wherein one of the dielectric material coated sides of the mirror reflects the pump beams, and the other thereof reflects backward amplified spontaneous emission (ASE) beams that are different from a wavelength band of signal beams output by the output optical fiber in a direction that is different from the direction in which the pump beams proceed or to a different position.

2. The semiconductor laser diode light source package of claim 1, wherein the output optical fiber is a double clad fiber configured with the core, the first cladding, and secondary cladding.

3. The semiconductor laser diode light source package of claim 1, wherein a gain medium is doped to the core of the output optical fiber.

4. The semiconductor laser diode light source package of claim 1, further comprising:
   a first collimation lens for transforming the signal beams into parallel beams and transmitting the same to the at least one mirror.

5. The semiconductor laser diode light source package of claim 1, wherein the at least one mirror transmits one of the signal beams and the pump beams and reflects the other thereof to transmit the signal beams to the core of the output optical fiber and transmit the pump beams to the first cladding of the output optical fiber.

6. The semiconductor laser diode light source package of claim 1, wherein the mirror has a wedge form.

7. The semiconductor laser diode light source package of claim 1, further comprising:
   a focusing lens for concentrating signal beams having passed through the mirror and pump beams reflected through the mirror and inputting the same to a core of the output optical fiber and a first cladding.

8. The semiconductor laser diode light source package of claim 1, further comprising:
   a gain medium connected to an end terminal of the output optical fiber.

9. The semiconductor laser diode light source package of claim 8, wherein an end cap is mounted to an end terminal of the output optical fiber.

10. The semiconductor laser diode light source package of claim 1, further comprising:
    a thermistor for measuring a temperature of the seed light source.

11. The semiconductor laser diode light source package of claim 1, further comprising:
a Peltier element for maintaining a temperature of the seed light source.

12. The semiconductor laser diode light source package of claim 1, further comprising:
an optical isolator provided between the seed light source and the at least one mirror.

13. The semiconductor laser diode light source package of claim 1, wherein the seed light source and the pump beam source are mounted on different Peltier elements.

14. A semiconductor laser diode light source package comprising:
a seed light source for outputting signal beams;
a pump beam source for outputting pump beams; and
at least one mirror for transmitting the signal beams to a core of an output optical fiber and transmitting the pump beams to a first cladding of the output optical fiber,
wherein the seed light source, the pump beam source, and the at least one mirror are realized in a semiconductor chip, and the output optical fiber is connected to an end terminal of the semiconductor laser diode light source package, and
wherein one of the dielectric material coated sides of the mirror reflects the pump beams, and the other thereof reflects backward amplified spontaneous emission (ASE) beams that are different from a wavelength band of signal beams output by the output optical fiber in a direction that is different from the direction in which the pump beams proceed or to a different position.

* * * * *